United States Patent
Chen et al.

(10) Patent No.: US 9,397,169 B2
(45) Date of Patent: Jul. 19, 2016

(54) EPITAXIAL STRUCTURES

(71) Applicant: Taiwan Semiconductor Manufacturing Company, Ltd., Hsin-Chu (TW)

(72) Inventors: Meng-Ku Chen, New Taipei (TW); Hung-Ta Lin, Hsin-Chu (TW); Pang-Yen Tsai, Jhu-Bei (TW); Huicheng Chang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/668,705

(22) Filed: Mar. 25, 2015

(65) Prior Publication Data

US 2015/0200258 A1    Jul. 16, 2015

Related U.S. Application Data

(62) Division of application No. 13/954,659, filed on Jul. 30, 2013, now Pat. No. 9,029,246.

(51) Int. Cl.
| | |
|---|---|
| H01L 29/00 | (2006.01) |
| H01L 29/205 | (2006.01) |
| H01L 29/06 | (2006.01) |
| H01L 21/762 | (2006.01) |
| H01L 29/78 | (2006.01) |

(52) U.S. Cl.
CPC ........ H01L 29/205 (2013.01); H01L 21/76224 (2013.01); H01L 29/0649 (2013.01); H01L 29/0688 (2013.01); H01L 29/785 (2013.01)

(58) Field of Classification Search
CPC .............. H01L 29/00; H01L 21/76224; H01L 21/76264; H01L 21/76229
USPC ................... 257/506.523; 438/479, 486, 494
See application file for complete search history.

(56) References Cited

U.S. PATENT DOCUMENTS

| | | |
|---|---|---|
| 5,074,955 A | 12/1991 | Henry et al. |
| 5,411,632 A | 5/1995 | Delage et al. |
| 8,742,509 B2 | 6/2014 | Lee et al. |

(Continued)

FOREIGN PATENT DOCUMENTS

| | | |
|---|---|---|
| KR | 1020130007412 | 1/2013 |

OTHER PUBLICATIONS

Hirotaka Kizuki, "Selective metalorganic chemical vapor deposition growth of GaAs on AiGaAs combined with in situ HC1 gas etching", Journal of Crystal Growth 134 (1993), pp. 35-42.

*Primary Examiner* — Phuc Dang
(74) *Attorney, Agent, or Firm* — Slater Matsil, LLP

(57) ABSTRACT

An embodiment is a method. A first III-V compound semiconductor is epitaxially grown in a trench on a substrate, and the epitaxial growth is performed in a chamber. The first III-V compound semiconductor has a first surface comprising a facet. After the epitaxial growth, the first surface of the first III-V compound semiconductor is etched to form an altered surface of the first III-V compound semiconductor. Etching the first surface is performed in the chamber in situ. A second III-V compound semiconductor is epitaxially grown on the altered surface of the first III-V compound semiconductor. The epitaxial growth of the first III-V compound semiconductor may be performed in a MOCVD chamber, and the etch may use an HCl gas. Structures resulting from methods are also disclosed.

20 Claims, 5 Drawing Sheets

(56) References Cited

U.S. PATENT DOCUMENTS

| | | |
|---|---|---|
| 2011/0117730 A1 | 5/2011 | Wann et al. |
| 2011/0306179 A1 | 12/2011 | Wann et al. |
| 2012/0028444 A1 | 2/2012 | Vellianitis |
| 2012/0037918 A1* | 2/2012 | Miyazaki et al. .............. 257/76 |
| 2012/0088344 A1* | 4/2012 | van Dal ........................ 438/283 |
| 2012/0269222 A1* | 10/2012 | Kyono et al. ............ 372/45.011 |
| 2012/0270378 A1 | 10/2012 | Kittler et al. |
| 2013/0001591 A1 | 1/2013 | Wu et al. |
| 2013/0234147 A1* | 9/2013 | Wu et al. ........................ 257/76 |
| 2014/0131724 A1* | 5/2014 | Bayram et al. ................. 257/76 |
| 2014/0151756 A1* | 6/2014 | Chang et al. .................. 257/288 |

* cited by examiner

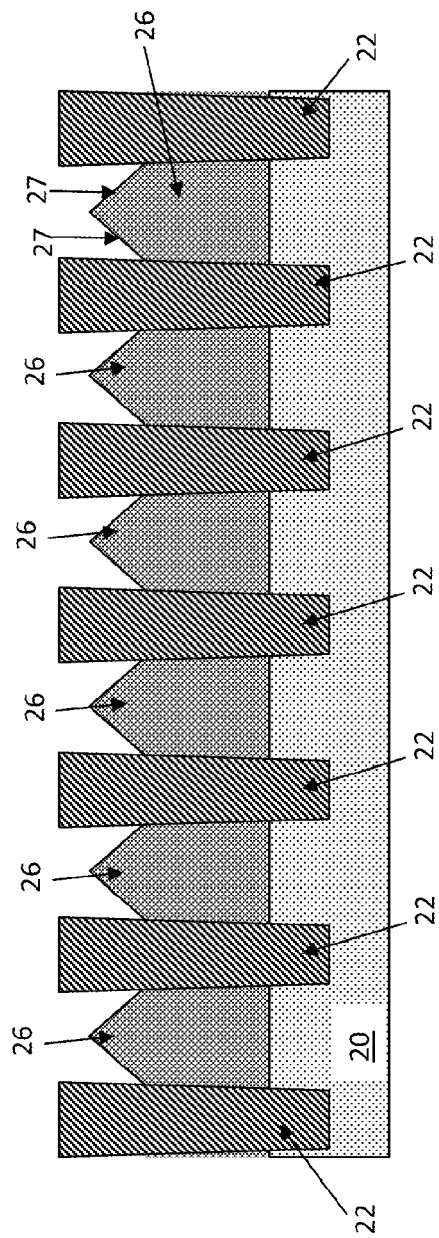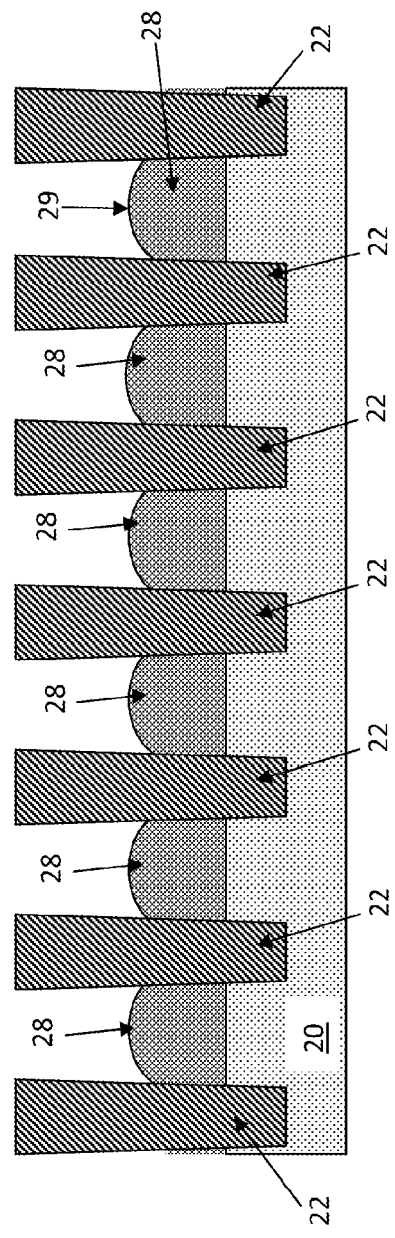

EPITAXIAL STRUCTURES

This application is a divisional of U.S. patent application Ser. No. 13/954,659, filed Jul. 30, 2013, entitled "Epitaxial Structures and Methods of Forming the Same," which application is hereby incorporated herein by reference in its entirety.

BACKGROUND

The speed of field effect transistors (FETs) is closely related to the drive currents of the FETs, which drive currents are further closely related to the mobility of charges. For example, NFETs have high drive currents when the electron mobility in their channel regions is high, while PFETs have high drive currents when the hole mobility in their channel regions is high. Compound semiconductor materials of group III and group V elements (known as III-V compound semiconductors) are good candidates for forming transistors due to their high electron mobility. Therefore, transistors formed on III-V compound semiconductors have been explored.

III-V compound semiconductor films, however, typically need to be grown on other substrates because it is difficult to obtain bulk III-V crystals. The growth of III-V compound semiconductor films on dissimilar substrates faces difficulties because these substrates have lattice constants and thermal expansion coefficients different than that of the III-V compound semiconductors. Various methods have been used to form high-quality III-V compound semiconductors that do not suffer from severe defects. For example, III-V compound semiconductors were grown from trenches between shallow trench isolation (STI) regions to utilize aspect ratio trapping (ART) to trap defects at the bottom of a III-V compound semiconductor film and to prevent defect propagation to a surface region.

Some structures using III-V compound semiconductors grown on dissimilar substrates in trenches between STI regions may integrate one III-V compound semiconductor grown on a different III-V compound semiconductor. In these instances, even with reduced defects at the surface region due to ART, defects, e.g., planar defects, may be generated by growing the III-V compound semiconductor on the different III-V compound semiconductor.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1 through 6 are a first process for forming an epitaxial structure according to an embodiment.

DETAILED DESCRIPTION OF ILLUSTRATIVE EMBODIMENTS

Figure 1:
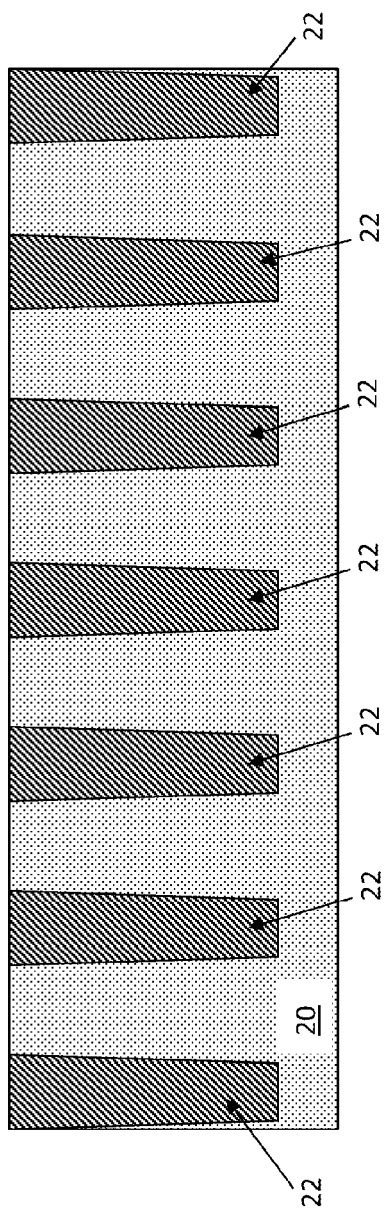

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely processes for forming an epitaxial structure for a fin field effect transistor (finFET). These processes can be used for heteroepitaxial or homoepitaxial structures, and also for other devices, such as other transistor structures, optical devices such as a light emitting diode (LED), and others. Further, specific embodiments discussed herein illustrate various surface orientations and materials. A person having ordinary skill in the art will readily understand that other embodiments may have differing surface orientations and/or materials, for example. Like reference characters used herein refer to like components. Although method embodiments may be discussed as being performed in a particular order, other method embodiments may be performed in any logical order.

FIGS. 1 through 6 illustrate a first process for forming an epitaxial structure and various intermediate structures according to an embodiment. In FIG. 1, isolation regions 22 are formed in a substrate 20. The substrate 20 includes a crystalline material that may be used as a template for subsequent epitaxial growth. The substrate 20 can be a bulk substrate, a semiconductor-on-insulator (SOI) substrate, or the like, and can comprise Si, SiGe, Ge, SiC, InAs, or the like, which may be the crystalline material used as the template. In a specific embodiment discussed herein, the substrate 20 is a bulk silicon substrate with a (100) surface orientation.

Recesses or trenches are etched into the substrate 20, and an isolation material is deposited into the trenches to form the isolation regions 22, which may be shallow trench isolation (STI) regions. The recesses or trenches may be etched using acceptable photolithographic and etching techniques, such as a sputter etch, reactive ion etching (RIE), capacitively coupled plasma (CCP), inductively coupled plasma (ICP), or the like. The isolation material may be an oxide (such as a silicon oxide), a nitride (such as silicon nitride), the like, or a combination thereof, deposited by a chemical vapor deposition (CVD) process, a thermal oxidation, the like, or a combination thereof. Any excess isolation material may be removed from the top surface of the substrate 20 by a planarization technique, such as a chemical mechanical polish (CMP), which may make the top surfaces of the isolation regions 22 co-planar with the top surface of the substrate 20.

Figure 2:
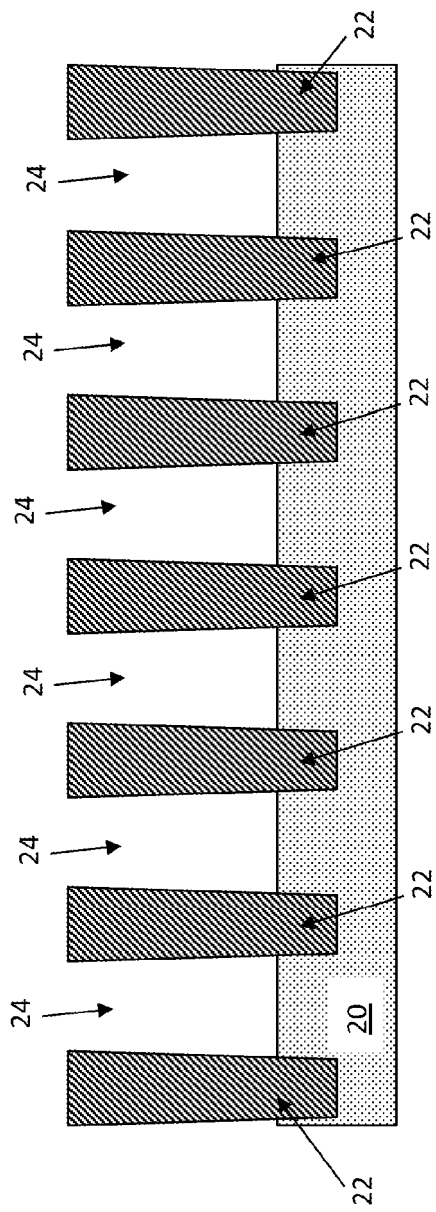

In FIG. 2, trenches 24 are formed by removing portions of the substrate 20 between adjacent isolation regions 22. These portions of the substrate 20 are etched to form the trenches 24. As illustrate, bottom surfaces of the trenches 24 (e.g., top surfaces of the substrate 20) are higher than bottom surfaces of adjacent isolation regions 22. In other embodiments, bottom surfaces of the trenches 24 may be substantially level with or lower than bottom surfaces of adjacent isolation regions 22. Other bottom surface profiles may also be used, such as substantially U or V shaped. The etching may be performed using a dry etch, with the etching gas selected from, for example, $CF_4$, $Cl_2$, $NF_3$, $SF_6$, or a combination thereof. In other embodiments, the etching may be performed using wet etching, for example, using Tetra-Methyl Ammonium Hydroxide (TMAH), a potassium hydroxide (KOH) solution, or the like, as an etchant. In the specific embodiment discussed herein where the original substrate 20 had a (100) surface orientation, the bottom surfaces of the trenches 24 also have a (100) surface orientation, and these bottom surfaces of the trenches 24 expose the crystalline material used as the template for the subsequent epitaxial growth.

The trenches 24 may be formed by other methods in other embodiments. For example, a dielectric layer can be deposited over the top surface of the substrate 20. The dielectric layer can be an oxide, a nitride, the like, or a combination thereof, deposited by a CVD process or the like. Then, a photolithography and etch process can etch trenches 24 in the dielectric layer to expose the top surface of the substrate 20 through the trenches 24 in the dielectric layer. The remaining portions of the dielectric layer can form the isolation regions 22.

In FIG. 3, a first crystalline semiconductor material 26 is epitaxially grown in the trenches 24. The first crystalline semiconductor material 26 has a natural lattice constant that is lattice-mismatched to the crystalline material used as the template in the substrate 20. The first crystalline semiconductor material 26 may include, for example, a group-III, a group-IV, or a group-V semiconductor material, or a combination thereof. Examples of a group-IV semiconductor material include Si, Ge, SiGe, SiC, or the like. Group-III and group-V semiconductor materials may include group-III and group-V (III-V) compound semiconductor materials, such as GaAs, AlAs, GaN, InP, InAs, InAlAs, InGaAs, GaSb, AlSb, InGaSb, AlP, GaP, or the like, including any binary, ternary, or quaternary compound thereof. The first crystalline semiconductor material 26 may be epitaxially grown using acceptable processes, such as metal-organic CVD (MOCVD) or other acceptable processes. The epitaxial growth process may include an etchant that removes any of the first crystalline semiconductor material 26 that nucleates on a non-crystalline surface, such as surfaces of the isolation regions 22, so that the epitaxial growth process is selective to growth substantially only on the underlying crystalline material template on which the epitaxial growth is initiated. The first crystalline semiconductor material 26 may be epitaxially grown to any height, such as lower than, level to, or higher than the top surfaces of adjacent isolation regions 22.

In the specific embodiment discussed herein, the first crystalline semiconductor material 26 is a III-V compound semiconductor material, particularly, GaAs, epitaxially grown by MOCVD. Typically, GaAs epitaxially grown by MOCVD on a (100) silicon surface in a trench as shown in FIG. 3 results in (111) facets in the GaAs. These (111) facets 27 are illustrated in FIG. 3. Other material, particularly other III-V compound semiconductor material, used for the first crystalline semiconductor material 26 formed by the same or other epitaxial growth techniques may undergo similar faceting.

FIG. 4 illustrates reduced first crystalline semiconductor material 28. After the epitaxial growth of the first crystalline semiconductor material 26 discussed with respect to FIG. 3, the first crystalline semiconductor material 26 is etched to reduce the facets 27 to form the reduced first crystalline semiconductor material 28. The etch results in top surfaces 29 of the reduced first crystalline semiconductor material 28 that are rounded and/or have different surface orientations, such as a (113) surface orientation. Any acceptable etch processes and etchants may be used for the etch. The etch may be performed in-situ in the epitaxial growth process chamber and subsequent to the epitaxial growth. Various modifications to the etch may be used to achieve a desired rounding and/or surface orientation of the reduced first crystalline semiconductor material 28.

In the specific embodiment discussed herein, the etch is performed in-situ in the MOCVD chamber used for the epitaxial growth of the GaAs. The etch uses a vapor hydrochloric (HCl) etchant. In this embodiment, the etch process temperature may be greater than about 600° C., such as approximately 700° C., and lower etch process temperatures may also be used, such as depending on the desired etch rate, for example, a higher temperature may result in a higher etch rate. Further, the flow rate of the HCl gas may vary depending on the desired etch rate, such as having a higher flow rate may result in a faster etch. The (111) facets 27 of the GaAs are reduced to the top surfaces 29 that are rounded surfaces and/or a (113) surface orientation.

A second crystalline semiconductor material 30 is epitaxially grown on the reduced first crystalline semiconductor material 28. The second crystalline semiconductor material 30 may be the same or a different material from the reduced first crystalline semiconductor material 28, and may have a natural lattice constant that is the same or different from the lattice constant of the reduced first crystalline semiconductor material 28. The second crystalline semiconductor material 30 may include, for example, a group-III, a group-IV, or a group-V semiconductor material, or a combination thereof, as discussed above. The second crystalline semiconductor material 30 may be epitaxially grown using acceptable processes, such as metal-organic CVD (MOCVD), molecular beam epitaxy (MBE), or other acceptable processes. In the specific embodiment discussed herein, the second crystalline semiconductor material 30 is a III-V compound, particularly, InP, epitaxially grown on the reduced GaAs.

Figure 5:
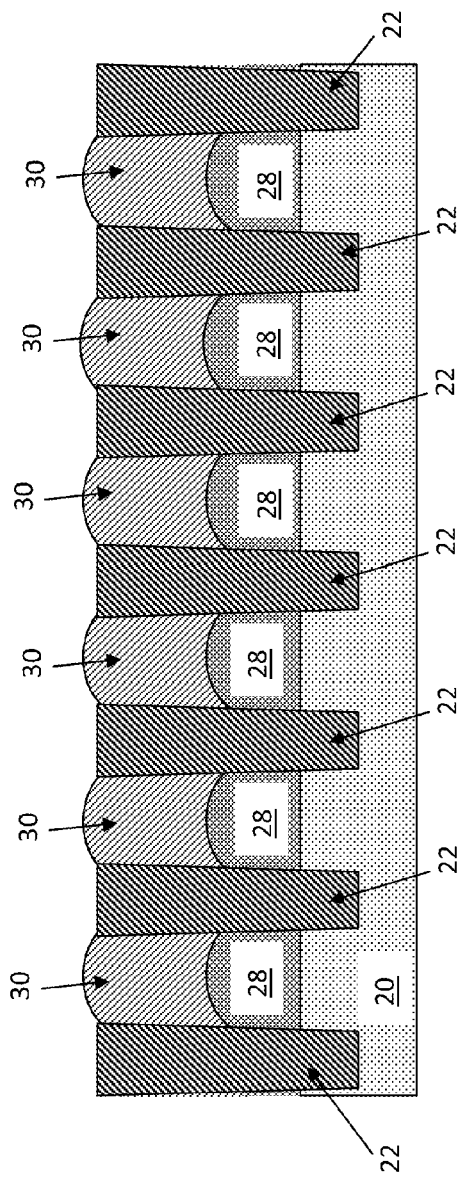
Figure 6:
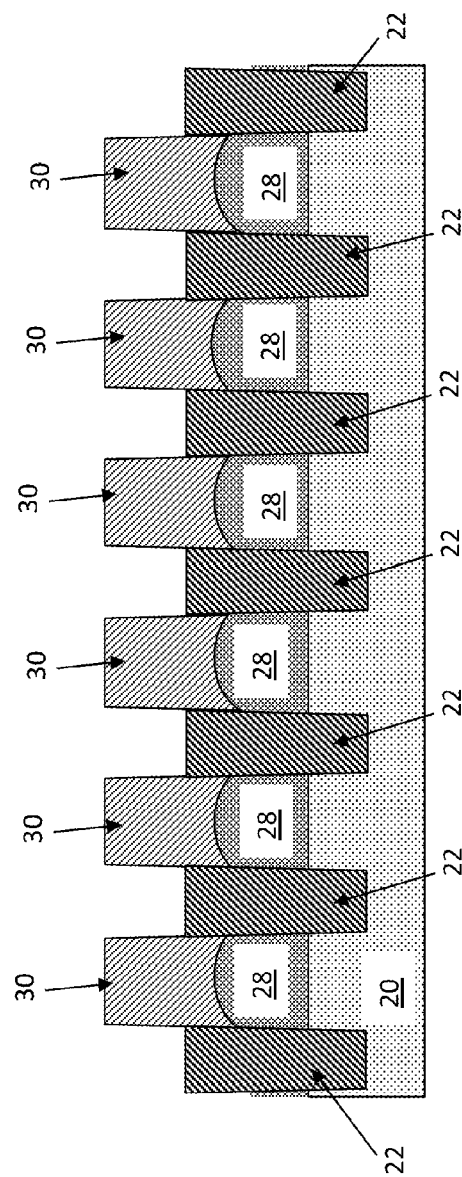

At this point, the structure in FIG. 5 may be used to form any appropriate device, such as a transistor, optical device, or others. FIG. 6 illustrates processing steps to form fins for a fin field effect transistor (finFET), for example. In FIG. 6, a planarization technique, such as a CMP, can be performed to planarize the second crystalline semiconductor material 30 such that the top surfaces are co-planar with top surfaces of the isolation regions 22. The isolation regions 22 are recessed, such as by a selective etch, such that the second crystalline semiconductor material 30 protrudes from between adjacent isolation regions 22. In this manner, the second crystalline semiconductor material 30 forms fins. Respective gate stacks, including a gate dielectric and a gate electrode over the gate dielectric, can be formed over the fins, and the fins can be doped to form source/drain regions. A person having ordinary skill in the art will readily understand how these components are formed, as well as any other processing that may be performed to form a finFET.

Figure 7:
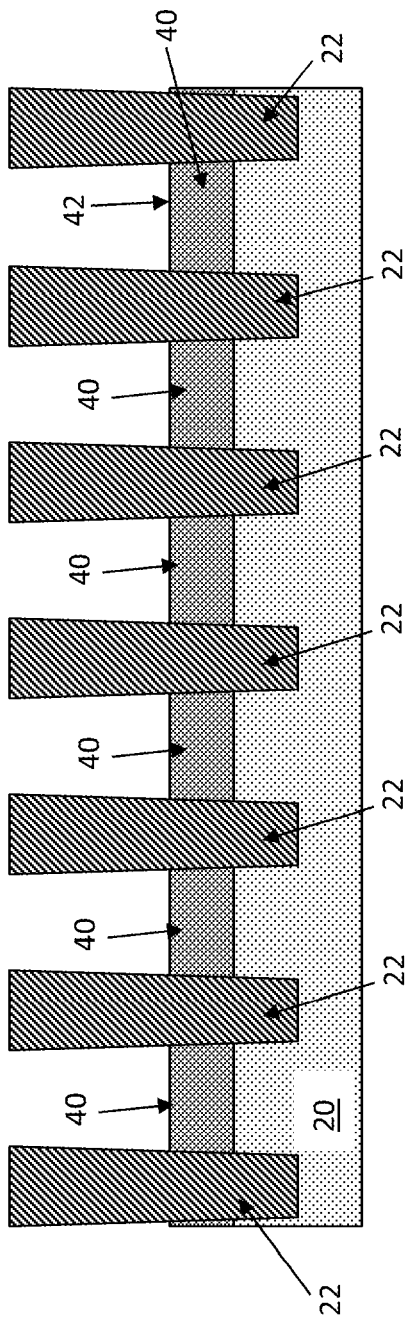
FIGS. 7 through 9 are a second process for forming an epitaxial structure according to an embodiment.
Figure 8:
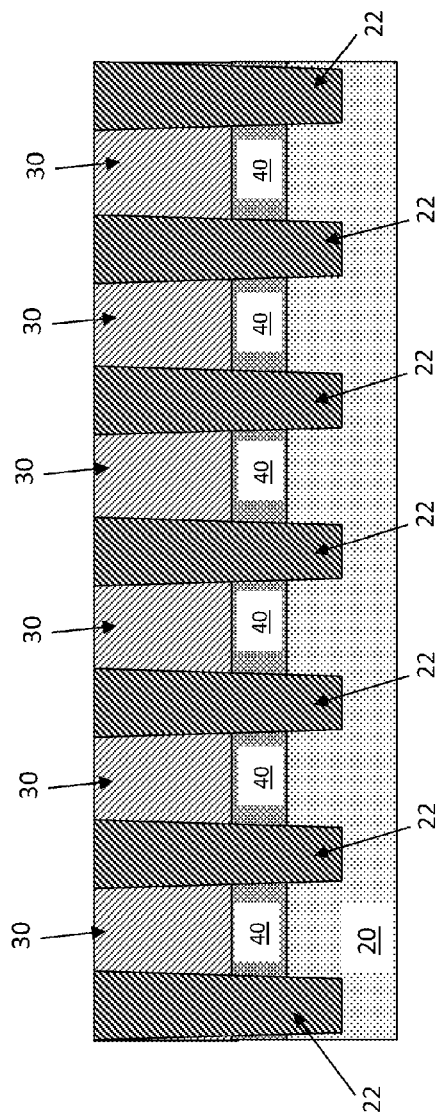
Figure 9:
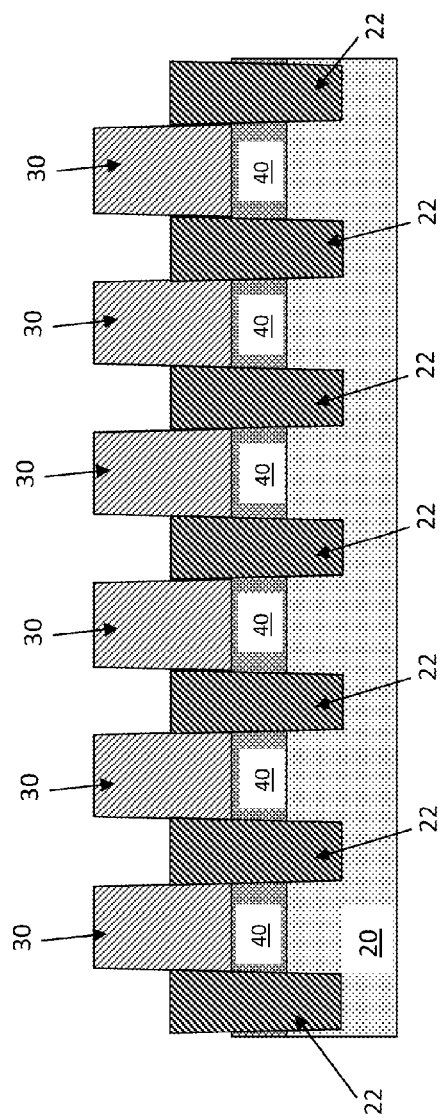

FIGS. 7 through 9 illustrate a second process for forming an epitaxial structure and various intermediate structures according to an embodiment. The processes discussed with respect to FIGS. 1 through 3 are performed. Then, similar to the discussion of FIG. 4, FIG. 7 illustrates that the first crystalline semiconductor material 26 is etched to form a reduced first crystalline semiconductor material 40. The etch is performed the same as discussed with respect to FIG. 4, but a process parameter is modified, such as having a longer duration of the etch, such that the reduced first crystalline semiconductor material 40 has planar top surfaces 42 that are parallel to the bottom surfaces of the trenches 24 (e.g., the top surfaces of the substrate 20). As a modification to the specific embodiment, the GaAs is etched such that the top surfaces of the GaAs have a (100) surface orientation.

As discussed with respect to FIG. 5, FIG. 8 illustrates a second crystalline semiconductor material 30 that is epitaxially grown on the reduced first crystalline semiconductor material 40. In the modified specific embodiment, the second crystalline semiconductor material 30 is InP epitaxially grown on the reduced GaAs.

At this point, the structure in FIG. 8 may be used to form any appropriate device, such as a transistor, optical device, or others. FIG. 9 illustrates processing steps to form fins for a fin field effect transistor (finFET), for example. These steps and other processing were discussed with respect to FIG. 6, and hence, are omitted here for brevity.

Some embodiments may achieve reduced planar defects, such as twin plane defects, in the second crystalline semiconductor material 30. By reducing a facet, such as a (111) facet, on a top surface of the first crystalline semiconductor material 26 to a rounded and/or different surface orientation, such as a (113) surface orientation, or to a planar surface, such as a (100) surface, planar defect suppression, such as of (111) planar defects, may be achieved in the subsequently epitaxially grown second crystalline semiconductor material 30. If a MOCVD process is used to epitaxially grow the first crystalline semiconductor material 26, the MOCVD process may be flexible to incorporate an in situ etch of the first crystalline semiconductor material 26, which may increase throughput and decrease costs compared to an ex-situ etch.

An embodiment is a method. A substrate with a trench is formed, and the trench is defined by an isolation region. A first III-V compound semiconductor is epitaxially grown in the trench, and the first III-V compound semiconductor has a first surface. The first surface of the first III-V compound semiconductor is etched to form a modified surface of the first III-V compound semiconductor. A second III-V compound semiconductor is epitaxially grown on the modified surface of the first III-V compound semiconductor.

Another embodiment is a method. A trench is formed on a substrate. The trench is defined by neighboring isolation regions. A first III-V compound semiconductor is epitaxially grown in the trench, and the epitaxial growth is performed in a chamber. The first III-V compound semiconductor has a first surface comprising a facet. After epitaxially growing the first III-V compound semiconductor, the first surface of the first III-V compound semiconductor is etched to form an altered surface of the first III-V compound semiconductor. Etching the first surface is performed in the chamber in situ. A second III-V compound semiconductor is epitaxially grown on the altered surface of the first III-V compound semiconductor.

A further embodiment is a structure. The structure comprises a (100) substrate comprising a trench, a first III-V compound crystalline semiconductor in the trench, and a second III-V compound crystalline semiconductor on the first III-V compound crystalline semiconductor. The trench is defined by an isolation region on the substrate. The first III-V compound crystalline semiconductor comprises a non-(111) surface distal from the substrate. The second III-V compound crystalline semiconductor is on the non-(111) surface.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a (100) substrate comprising a trench, the trench being defined at least in part by a first isolation region on the substrate;
   a first III-V compound crystalline semiconductor in the trench, the first III-V compound crystalline semiconductor comprising a (113) surface distal from the substrate; and
   a second III-V compound crystalline semiconductor on the (113) surface of the first III-V compound crystalline semiconductor.

2. The structure of claim 1, wherein the first III-V compound crystalline semiconductor is GaAs.

3. The structure of claim 1, wherein the second III-V compound crystalline semiconductor protrudes above the first isolation region to form a fin, and further comprising:
   a gate stack over the fin; and
   source/drain regions disposed in the fin.

4. The structure of claim 1, wherein a surface of a crystalline material of the substrate defines a bottom surface of the trench, the crystalline material being a different material from the first III-V compound crystalline semiconductor.

5. The structure of claim 1, further comprising a second isolation region on the substrate, the trench being defined at least in part by the second isolation region.

6. The structure of claim 5, wherein the first III-V compound crystalline semiconductor and the second III-V compound crystalline semiconductor are partially disposed between the first isolation region and the second isolation region.

7. The structure of claim 5, wherein the (113) surface of the first III-V compound crystalline semiconductor contacts a first surface of the first isolation region.

8. The structure of claim 7, wherein the (113) surface of the first III-V compound crystalline semiconductor is below respective upper surfaces of the first isolation region and the second isolation region.

9. The structure of claim 1, wherein the second III-V compound crystalline semiconductor is InP.

10. A structure comprising:
    a (100) substrate having a first isolation region and a second isolation region;
    a first III-V compound semiconductor material over the substrate and between the first isolation region and the second isolation region, the first III-V compound semiconductor material having an upper surface extending from the first isolation region to the second isolation region, the upper surface of the first III-V compound semiconductor material being below respective upper surfaces of the first isolation region and the second isolation region, the upper surface of the first III-V compound semiconductor material not having a (111) facet and having a rounded surface; and
    a second III-V compound semiconductor material over the upper surface of the first III-V compound semiconductor material.

11. The structure of claim 10, wherein the second III-V compound semiconductor material protrudes above the respective upper surfaces of the first isolation region and the second isolation region to form a fin, the fin being a component of a fin field effect transistor (finFET).

12. The structure of claim 10, wherein the second III-V compound semiconductor material contacts the upper surface of the first III-V compound semiconductor material.

13. The structure of claim 10, wherein the first III-V compound semiconductor material contacts a surface of a crystalline material of the substrate between the first isolation region and the second isolation region, the crystalline material being a different material from the first III-V compound semiconductor material.

14. The structure of claim 10, wherein the substrate is a silicon substrate, the first III-V compound semiconductor material is GaAs, and the second III-V compound semiconductor material is InP.

15. The structure of claim 10, wherein the second III-V compound semiconductor material has an upper surface that is substantially planar.

16. A structure comprising:
a first III-V compound material over a (100) substrate, the first III-V compound material being between a first isolation region and a second isolation region on the substrate, an upper surface of the first III-V compound material being defined extending from a first surface of the first isolation region to a second surface of the second isolation region, the upper surface of the first III-V compound material being below respective upper surfaces of the first isolation region and the second isolation region, the upper surface of the first III-V compound material not including a (111) surface and including a (100) surface; and
a second III-V compound material over the upper surface of the first III-V compound material, the second III-V compound material being at least partially disposed between the first isolation region and the second isolation region and below the respective upper surfaces of the first isolation region and the second isolation region, the second III-V compound material protruding above the respective upper surfaces of the first isolation region and the second isolation region to form a fin.

17. The structure of claim 16 further comprising:
a gate stack over the fin; and
source/drain regions disposed in the fin.

18. The structure of claim 16, wherein the first III-V compound material is GaAs and the second III-V compound material is InP.

19. The structure of claim 16, wherein the second III-V compound material contacts the upper surface of the first III-V compound material.

20. The structure of claim 16, wherein the second III-V compound material has an upper surface that is substantially planar.

* * * * *